US009681570B2

(12) United States Patent
Leggett et al.

(10) Patent No.: US 9,681,570 B2
(45) Date of Patent: Jun. 13, 2017

(54) WELDED HIGH-DENSITY LOW-PROFILE INTERCONNECT SYSTEM

(71) Applicant: Apple Inc., Cupertino, CA (US)

(72) Inventors: William F. Leggett, San Jose, CA (US); John Raff, Menlo Park, CA (US)

(73) Assignee: Apple Inc., Cupertino, CA (US)

( * ) Notice: Subject to any disclaimer, the term of this patent is extended or adjusted under 35 U.S.C. 154(b) by 220 days.

(21) Appl. No.: 14/487,869

(22) Filed: Sep. 16, 2014

(65) Prior Publication Data

US 2016/0081193 A1     Mar. 17, 2016

(51) Int. Cl.
*H05K 1/00*     (2006.01)
*H05K 7/14*     (2006.01)
*H05K 3/36*     (2006.01)
*H05K 1/18*     (2006.01)

(52) U.S. Cl.
CPC ........... *H05K 7/1427* (2013.01); *H05K 3/361* (2013.01); *H05K 3/368* (2013.01); *H05K 1/189* (2013.01); *H05K 3/363* (2013.01); *H05K 2201/09918* (2013.01); *H05K 2201/10128* (2013.01); *H05K 2203/107* (2013.01)

(58) Field of Classification Search
CPC .... H05K 1/0266; H05K 1/028; H05K 1/0298; H05K 1/111; H05K 1/115; H05K 1/14; H05K 2201/01; H05K 2201/042; H05K 2201/09936; H05K 7/1427
See application file for complete search history.

(56) References Cited

U.S. PATENT DOCUMENTS

| | | | |
|---|---|---|---|
| 7,945,169 B2 | 5/2011 | Oki et al. | |
| 8,007,286 B1* | 8/2011 | Holec | H01R 4/02 439/65 |
| 8,242,518 B2 | 8/2012 | Lerman et al. | |
| 8,256,300 B2 | 9/2012 | Willner et al. | |
| 2004/0240803 A1* | 12/2004 | Rechberger | G02B 6/4201 385/93 |
| 2010/0271735 A1* | 10/2010 | Schreiber | G11B 5/5552 360/290 |
| 2011/0255250 A1 | 10/2011 | Dinh et al. | |
| 2012/0069536 A1* | 3/2012 | Sporon-Fiedler | H05K 1/111 361/760 |
| 2012/0115262 A1 | 5/2012 | Menard et al. | |
| 2013/0003268 A1* | 1/2013 | Cheon | H05K 5/02 361/679.01 |
| 2013/0082984 A1* | 4/2013 | Drzaic | G09G 3/20 345/204 |
| 2014/0126167 A1* | 5/2014 | Bozorgi | B81C 1/00269 361/760 |

* cited by examiner

*Primary Examiner* — Yuriy Semenenko
(74) *Attorney, Agent, or Firm* — Treyz Law Group, P.C.; G. Victor Treyz; Michael H. Lyons

(57) ABSTRACT

An electronic device may have printed circuits to which electrical components are mounted. The printed circuits may have metal traces that form signal lines and contact pads. Vias or other conductive structures may be used in interconnecting the signal lines to the contact pads. The contact pads may have elongated shapes or other shapes and may be formed in arrays on the printed circuits. Laser welds or other electrical connections may be used to join contact pads on a first printed circuit to respective contact pads on a second printed circuit. The laser welds may form part of a rectangular region of welds or may form part of a non-rectangular region of welds such as a region with a curved edge. Alignment marks may be used in aligning the contact pads.

15 Claims, 10 Drawing Sheets

WELDED HIGH-DENSITY LOW-PROFILE INTERCONNECT SYSTEM

BACKGROUND

This relates generally to electronic devices, and, more particularly, to interconnecting printed circuits in electronic devices.

Electronic devices include electronic components such as integrated circuits, sensors, and other circuitry. Electronic components may be mounted on printed circuit boards. Printed circuits may also be used to form signal cables.

Plastic connectors with interlocking met pins can be soldered to printed circuit substrates. To interconnect the signal paths on one printed circuit to the signal paths on another printed circuit, mating connectors on the two printed circuits can be plugged into each other so that the pins of the connectors form electrical connections. Connectors such as these can be time consuming to design and test, sometimes consume more volume than desired, and do not always provide as much electromagnetic shielding as desired. Cowlings may be used to ensure that connectors do not become detached from one another during as drop event or other stress on a device, but the use of cowlings may consume valuable space within an electronic device. Connector footprints tend to be rectangular, but reliance on rectangular connectors can make it difficult or impossible to efficiently accommodate non-rectangular printed circuit connection regions.

It would therefore be desirable to be able to provide improved ways in which to interconnect printed circuits in an electronic device.

SUMMARY

An electronic device may have printed circuits to which electrical components are mounted. The printed circuits may have metal traces that form signal lines and contact pads. The printed circuits may contain vias such as through vias and blind vias. Vias or other conductive structures may be used in interconnecting the signal lines and the contact pads.

The signal lines on overlapping printed circuits can be joined by forming welds between mating contact pads. No connectors are needed, so the weld-based interconnection region may exhibit a low profile. Welds May be used to form robust permanent connections.

The contact pads may have elongated shapes or other shapes to facilitate alignment operations. Contacts may be formed in arrays on the printed circuits. Laser welding or other techniques may be used in joining contact pads on a first printed circuit with respective contact pads on a second printed circuit. The laser welds may form part of a rectangular region of welds or may form part of a non-rectangular region of welds such as a region with a curved edge that accommodates a structure within an electronic device. Alignment marks may be used in aligning arrays of mating contacts on overlapping printed circuits.

DETAILED DESCRIPTION

Electrical components in an electronic device may be interconnected using signal paths in printed circuits. Printed circuits may be joined with each other using selectively formed connections such as welded connections. The selectively formed connections may be formed at the intersections between signal lines on one printed circuit and signal lines on another printed circuit.

Figure 1:
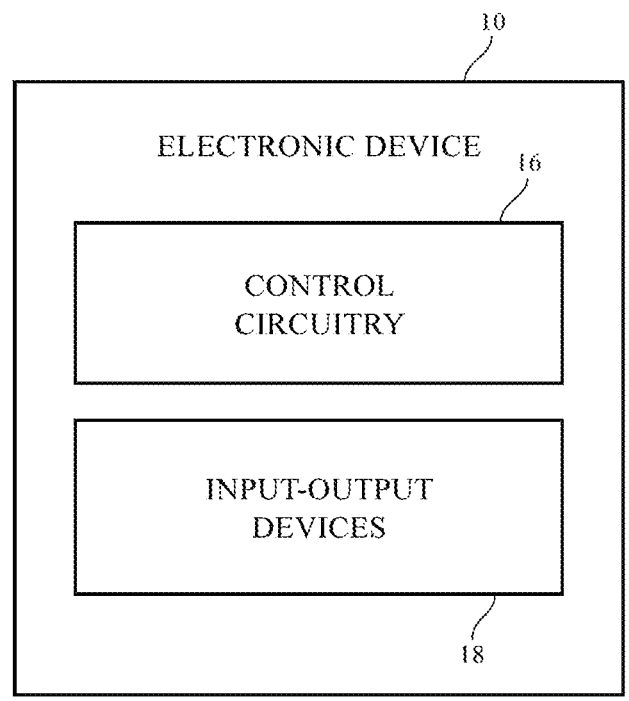
FIG. 1 is a schematic diagram of an illustrative electronic device in accordance with an embodiment.

An illustrative electronic device of the type that may include printed circuits that are interconnected using selectively formed connections is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors and other wireless communications circuits, power management units, audio chips, application specific integrated circuits, etc.

Input-output circuitry in device 10 such as input-output devices 18 may be used to allow data to be supplied to device 10 and to allow data to be provided from device 10 to external devices. Input-output devices 18 may include buttons, joysticks, scrolling wheels, touch pads, key pads, keyboards, microphones, speakers, tone generators, vibrators, cameras, sensors such as touch sensors, proximity sensors, ambient light sensors, compasses, gyroscopes, accelerometers, light-emitting diodes and other status indicators, data ports, etc. A user can control the operation of device 10 by supplying commands through input-output devices 18 and may receive status information and other output from device 10 using the output resources of input-output devices 18.

Input-output devices 18 may include one or more displays. Device 10 may, for example, include a touch screen display that includes a touch sensor for gathering touch input from a user or a display that is insensitive to touch. A touch sensor for a display in device 10 may be based on an array of capacitive touch sensor electrodes, acoustic touch sensor structures, resistive touch components, force-based touch sensor structures, a light-based touch sensor, or other suitable touch sensor arrangements.

Power the device 10 may be provided by an external source of power and/or an internal battery. The components for device 10 such as circuitry 16 and devices 18 and other structures in device 10 may be implemented using integrated circuits, discrete components (e.g., resistors, capacitors, and inductors), microelectromechanical systems (MEMS) devices, portions of housing structures, packaged parts, and other devices and structures.

Control circuitry 16 may be used to run software on device 10 such as operating system code and applications. During operation of device 10, the software running on control circuitry 16 may display images for a user on one or more displays and may use other internal components such as input-output devices 18. Device 10 may use communications circuits to send and receive wireless and wired data. For example, device 10 may use light-emitting components to transmit data and may use light-receiving components to receive transmitted light signals. Device 10 may also use light-emitting components, light-receiving components, audio components, capacitive sensors, microelectromechanical systems devices, and other components as sensors and output devices. Device 10 may use wireless circuits in circuitry 16 (e.g., a baseband processor and associated radio-frequency transceiver circuitry) to transmit and receive wireless signals. For example, device 10 may transmit and receive cellular telephone signals and/or wireless local area network signals or other wireless data.

Figure 2:
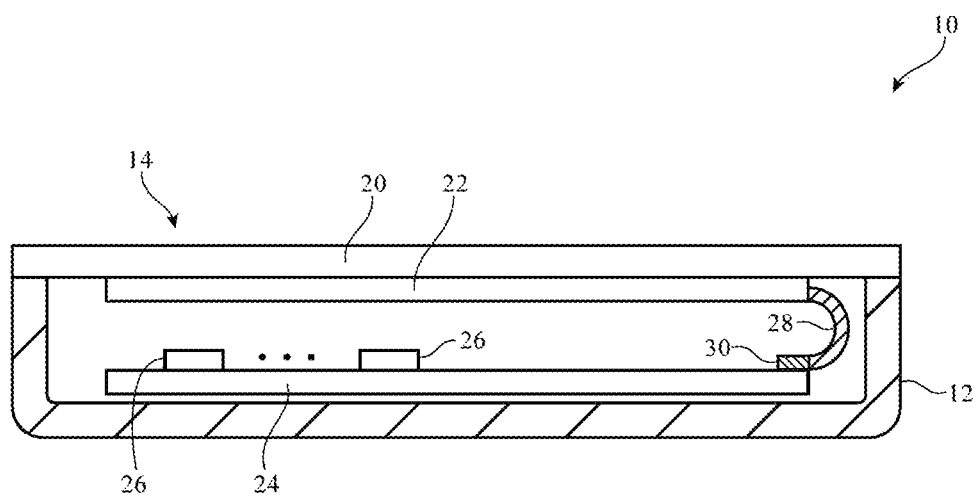
FIG. 2 is a cross-sectional side view of an illustrative electronic device in accordance with an embodiment.

A cross-sectional side view of an illustrative electronic device is shown in FIG. 2. As shown in FIG. 2, device 10 may have a housing such as housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.). Device 10 may have inner housing structures that provide additional structural support to device 10 and/or that serve as mounting platforms for printed circuits and other structures. Structural internal housing members may sometimes be referred to as housing structures and may be considered to form part of housing 12.

Device 10 may have a display such as display 14. Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures.

Display 14 of device 10 may be formed from a display module such as display module 22 mounted under a cover layer such as display cover layer 20 (as an example). Display 14 (display module 22) may be a liquid crystal display, an organic light-emitting diode display, a plasma display, an electrophoretic display, a display that is insensitive to touch, a touch sensitive display that incorporates and array of capacitive touch sensor electrodes or other touch sensor structures, or may be any other type of suitable display. Display cover layer 20 may be planar or curved and may be formed from clear glass, a transparent plastic member a transparent crystalline member such as a sapphire layer, clear ceramics, other transparent materials, or combinations of these structures.

Electrical components 26 may be mounted within the interior of housing 12. Components 26 may be mounted to printed circuits such as printed circuit 24 within the interior of housing 12. Printed circuit 24 may be a rigid printed circuit board (e.g., a printed circuit board formed from fiberglass-filled epoxy or other rigid printed circuit board material) or may be a flexible printed circuit (e.g., a printed circuit formed from a sheet of polyimide or other flexible polymer layer). Patterned metal traces within primed circuit board 24 may be used to form signal paths between components 26. If desired, components such as connectors may be mounted to printed circuit 24. As shown in FIG. 2, for example, a cable such as flexible printed circuit cable 28 may couple display module 22 to connector 30. Connector 30 may couple cable 28 to traces within printed circuit 24. When coupled as shown in FIG. 2, signals associated with operation of display 14 may pass to display module 22 from signal lines in printed circuit 24 through cable 28 and connector 30.

Figure 3:
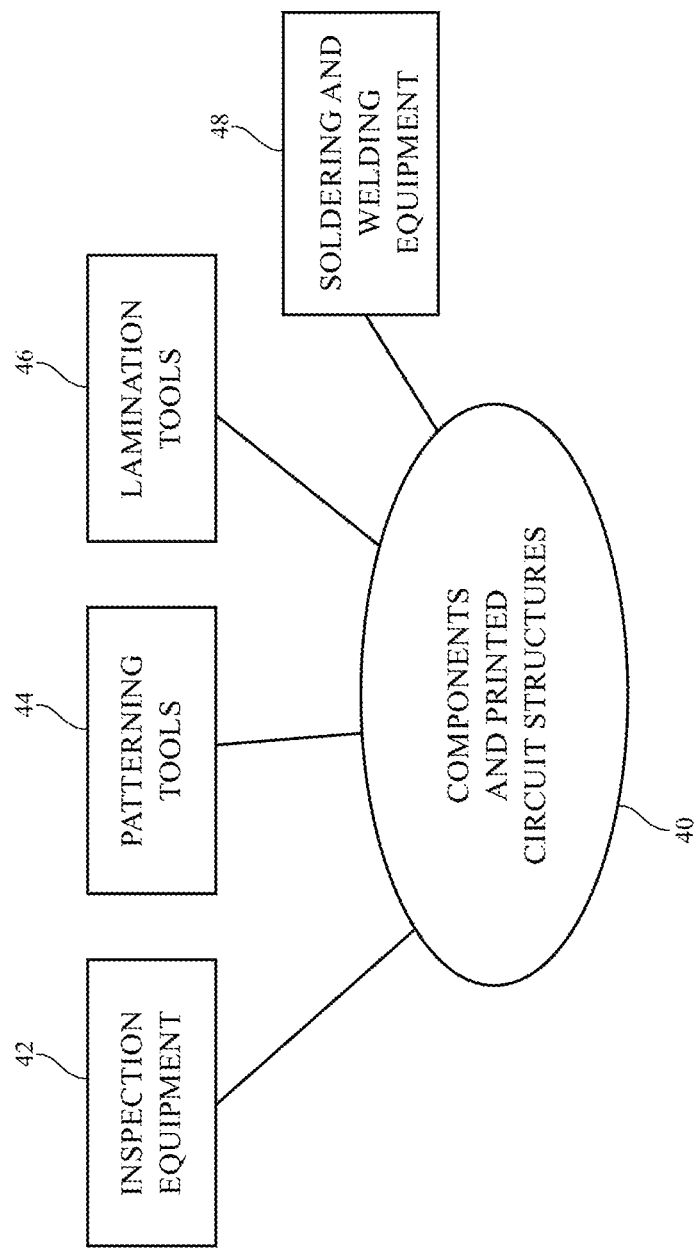
FIG. 3 is a diagram of illustrative equipment that may be used in forming interconnections between printed circuits in accordance with an embodiment.

The use of connectors such as connector 30 can be minimize or even eliminated using connections such as welded connections between overlapping signal traces on respective printed circuits. Illustrative equipment of the type that may be used in forming welded interconnections between printed circuits is shown in FIG. 3. As shown in FIG. 3, printed circuits and components 40 (e.g., printed circuits 24 and components 26) may be processed using inspection equipment 42, patterning tools 44, lamination tools 46, soldering and welding equipment 48, and other equipment.

Patterning tools 44 may be used in forming desired patterns of signal lines in printed circuits 24. Metal traces for printed circuit signal paths may be patterned using photolithography, by evaporating metal through a shadow mask, by stamping a desired metal pattern into a layer of metal foil, or using other suitable patterning techniques. Patterning tools 44 may include cutting tools, etching tools, deposition equipment, equipment for machining metal and other structures, drilling equipment, and other suitable equipment.

Inspection equipment 42 may include manually controlled and/or automated equipment for inspecting the structures associated with components and primed circuit structures 40 before assembly and during manufacturing operations. Equipment 42 may include optical inspection equipment, visible light inspection equipment, infrared light inspection equipment, X-ray inspection equipment, equipment that uses microscopes and other optical equipment to gather images of structures 40, and equipment that digitizes images so that digitized image data may be used in automatically aligns structuring and otherwise processing structures 40. Equipment 42 may include machine vision equipment that digitally captures images of structures 40 using optical camera equipment, X-ray camera equipment, or other image sensor. Information gathered on structures 40 using a machine vision system or other inspection equipment may be used by the other equipment of FIG. 3 in processing components and printed circuit structures 40. For example, machine vision data from equipment 42 may be used to align metal traces on first and second printed circuit boards with each other and may be used to position a laser welding beam at a desired location relative to the metal traces.

Lamination tools 46 may be used to attach printed circuit layers together. For example, lamination tools 46 may be used to attach metal interconnect layers and dielectric layers in a stack that forms a printed circuit (e.g., printed circuit 24). Adhesive may optionally be used in attaching layers together. Tools 46 may attach metal layers to dielectric substrate layers such as layers of polyimide, other polymers, fiberglass-filled epoxy for rigid printed circuit board substrates, etc. Metal traces may be formed on printed circuit board substrates by depositing blanket metal layers and patterning the deposited layers using patterning tools 44 or may be patterned prior to attachment to a printed circuit board structure using lamination tools 46.

Soldering, and welding equipment 48 may be used to attach components to printed circuits in structures 40. For example, soldering equipment such as a reflow oven or hot bar may be used to heat solder paste on a printed circuit sufficiently to melt the solder and thereby attach an electrical component to that printed circuit. Soldering equipment (e.g., a hot bar) may also be used in forming solder connections between interconnect lines in respective overlapping printed circuits. With one suitable arrangement, which may sometimes be described herein as an example, laser welding equipment or other welding equipment is used to selectively weld metal traces together from different printed circuits.

A first printed circuit and a second printed circuit may, for example, be provided with respective metal trace segments. These metal trace segments may overlap in an array pattern. Laser welding may be used to weld together some of the metal trace segments from the first printed circuit and some of the metal trace segments from the second printed circuit. The pattern of laser welds that is formed in this way can serve as a connector that joins the signal lines on the first printed circuit to the signal lines on the second printed circuit.

The welds may consume less vertical space (i.e., less height) than a plastic connector that is soldered to the printed circuits, allowing the welded printed circuit area to serve as a low-profile connector. The density of the welds (i.e., the weld-to-weld pitch) may be 10-100 microns, more than 20 microns, less than 30 microns, less than 15 microns, or other suitable density. If desired for example, the welded printed circuits may form a high density connector. The shape of the printed circuits that are being coupled and the corresponding shape of the Welded area can have curved edges or other shapes that help the printed circuit avoid internal device components while efficiently using area mailable within device 10 to provide suitable printed-circuit-to-printed-circuit connections.

Figure 4:
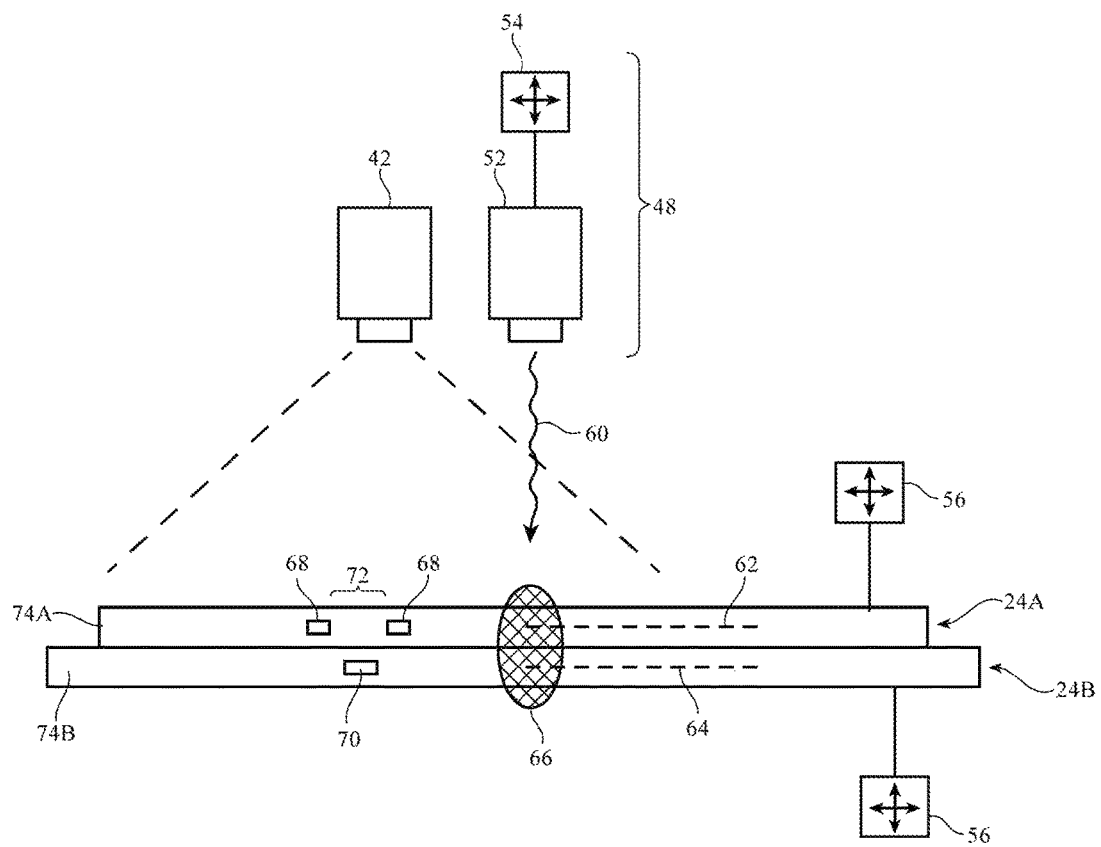
FIG. 4 is a cross-sectional side view of an illustrative pair of printed circuits being aligned, and interconnected using machine vision equipment and laser welding equipment in accordance with an embodiment.

A cross-sectional side view of an illustrative pair of printed circuits that are being interconnected in this way is shown in FIG. 4. As shown in FIG. 4, printed circuits 24A and 24B may overlap sufficiently to allow circuit-to-circuit connections such as connection 66 to be formed. Printed circuit 24A has metal traces 62 in dielectric substrate 74A. Printed circuit 24B has metal traces 64 in dielectric substrate 74B. Dielectric substrates 74A and 74B may be rigid and/or flexible substrates formed from layers of flexible polyimide or other flexible printed circuit polymer substrate material rigid printed circuit board material, or other insulating substrate material. Metal traces 62 and 64 may be formed in one or more layers within printed circuits 24A and 24B (i.e., printed circuits 24A and/or 24B may be single layer printed circuits or multilayer printed circuits).

Each connection 66 may be a welded connection or other conductive connection that shorts a trace in printed circuit 24A such as trace 62 to a trace in printed circuit 24B such a trace 64. There may be any suitable number of connections between the traces of printed circuits 24A and 24B (e.g., one or more, two or more, ten or more 100 or more, less than 500, less than 200, 10-100, etc.). A single connection such as connection 66 is shown in FIG. 4 to avoid over-complicating the drawings.

Connections such as connection 66 may be formed by welding. As an example, connections such as connection 66 may be formed by laser welding using equipment 48. Equipment 48 may include a laser such as laser 52. Laser 52 may produce a laser beam such as laser beam 60 that is focused onto printed circuits 24A and 24B to weld together overlapping traces such as traces 62 and 64, thereby forming welded connection 66. Laser beam 60 may be an infrared light beam, a visible light beam, or other laser beam. A computer-controlled positioner such as positioner 4 may be used to adjust the position of laser beam 60 (e.g., by moving the position of laser 52, by adjusting mirror positions, etc.) so that beam 60 is directed onto the locations in printed circuits 24A and 24B where contact pads are overlapping. If desired computer-controlled positioners such as positioners 56 may be used to move printed circuits 24A and/or 24B relative to laser 52 in addition to or instead of moving laser 52 and beam 60 relative to printed circuits 24A and 24B.

Before welding traces 62 and 64 to each other, printed circuits 24A and 24B should be aligned with each other, so that appropriate portions of traces 62 and 64 (i.e., contact pad portions) overlap as desired. Computer-controlled positioners 56 may be used to perform alignment operations. To assist in performing alignment operations, machine vision equipment such as inspection equipment 42 may be used to observe the relative positions of printed circuits 24A and 24B. Printed circuits 24A and 24B may have alignment marks such as alignment mark 68 in printed circuit 24A and alignment mark 70 in printed circuit 24B. Alignment marks 68 and 70 may be formed from metal traces or other suitable structures in printed circuits 24A and 24B. Alignment marks 68 and 70 may have the shape of crosses, circles, nested squares, segmented squares or crosses, lines, dots, or other suitable shapes. In the example of FIG. 4, alignment mark 68 has an opening such as opening 72 within which alignment mark 70 is visible when marks 68 and 70 are in alignment with each other.

The locations of alignment marks 68 and 70 may be observed using visual light cameras, infrared light cameras, x-ray cameras, or other inspection equipment 42. To facilitate visual alignment of marks 68 and 70 to each other, it may be desirable to form some or all of printed circuits 24A and or 24B from a transparent or semi-transparent substrate material (e.g., clear or amber polyimide). For example, upper layer 24A may be formed from a material that is transparent in the visible spectrum so that a visible-light camera in system 42 can observe the position of lower-layer alignment mark 70 through the substrate material of upper layer 24A.

In some applications it may be desirable to form printed circuits in device 10 from a visually opaque material. In this type of scenario, the relative positions of alignment marks 68 and 70 may be observed using x-ray inspection equipment or an infrared image sensor that is able to penetrate the visibly opaque material. For example, the visibly opaque material may be formed from an infrared-transparent material (e.g., ink on a substitute, an additive in a polymer substrate, or other materials that are transparent at infrared wavelengths and opaque at visible wavelengths). Printed circuits 24A and/or 24B may also be treated with a coating or other material following printed circuit alignment and formation of welded connections. For example, a visually opaque material may be applied to printed circuits 24A and/or 24B following alignment of marks 68 and 70 and if desired following formation of welded connections 66.

There may one or more different types of alignment marks on printed circuits 24A and 24B. For example, a single set of alignment marks may be used for coarse and fine alignment operations. As another example, a single set of coarse alignment marks may be formed so that time alignment operations are performed exclusively by observing the overlap and alignment of traces 62 and 64 with respect to each other. More alignment marks (e.g., coarse, medium, and fine alignment marks) may also be used. In some situations, coarse and fine alignment operations can be performed using only signal lines 62 and 64 or other alignment mark schemes may be used.

An advantage of using alignment marks 68 and 70 for coarse alignment is that the use of alignment marks may facilitate automatic alignment operations using machine vision equipment (e.g., camera(s) in equipment t) and computer-controlled positioners such as positioners 56. Fine alignment operations such as operations involved in establishing final alignment between overlapping contact portions of traces 62 and 64 may be performed using an automated approach and/or manual alignment. For example, fine alignment may be performed by capturing images using system 42 and adjusting the positions of printed circuits 24 and 24B accordingly. Laser beam 60 may likewise be aligned using computer-controlled positioner 54 to adjust laser 52 in equipment 48. If desired, some or all of these operations may also be performed under the manual control of a technician (e.g., a technician controlling positioners 56 and/or 54).

During laser welding, the metal of overlapping portions of traces 62 and 64 is welded together and forms an electrical connection between traces 62 and 64 (i.e., laser welds such as welds 66 are formed). The pattern of welds that is established may follow a predetermined pattern (e.g., a two-dimensional matrix of N rows and M columns or a pattern of connections with other shapes) or may be selected dynamically to accommodate last-mute design changes, detected defects in printed circuits 24A and/or 24B, or other factors that might influence the desired placement of welds 66 on printed circuits 24A and 24B. The shape of the region of welds that is formed may be rectangular or may be non-rectangular.

Figure 5:
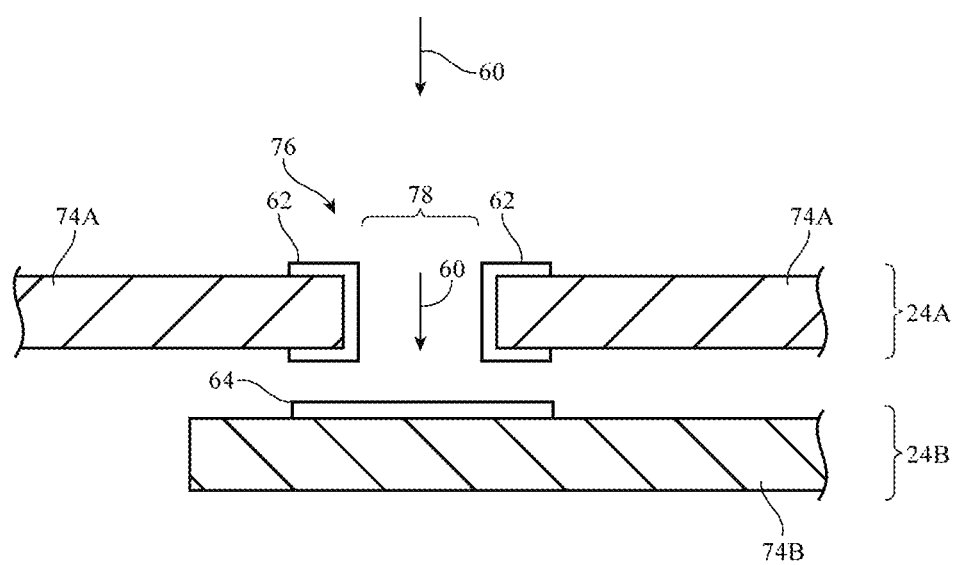
FIG. 5 is a cross-sectional side view of an illustrative via structure that may be used to facilitate welding of contact pads in first and second printed circuits in accordance with an embodiment.

As shown in FIG. 5, vias such as via 76 may be formed in printed circuit 24A. Via 76 may be formed by plating metal traces 62 onto the inner surfaces of through hole 78 in printed circuit substrate 74A. Because though hole 78 passes through substrate 74A, vias such as via 76 may sometimes be referred to as through hole vias or through vias. As shown in FIG. 5, the presence of opening 78 in via 76 of printed circuit 24A may help laser beam 60 to penetrate through to traces 64 on lower printed circuit 24B during welding.

Figure 6:
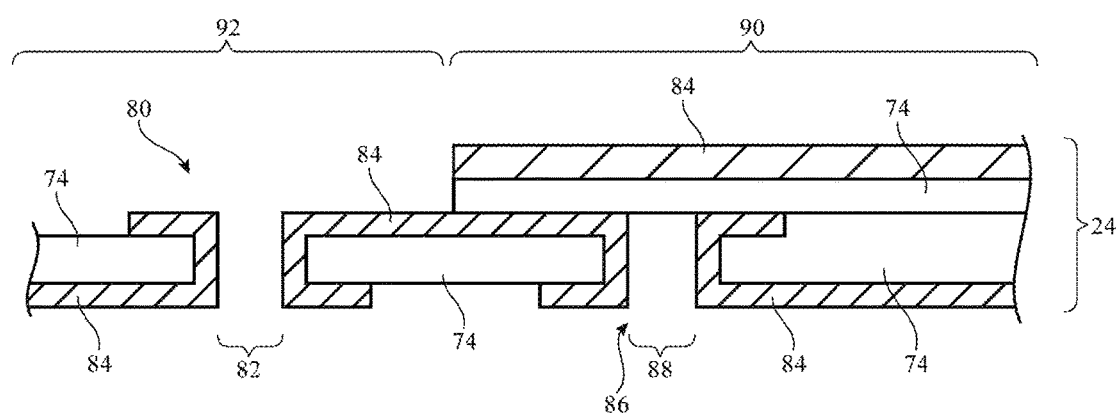
FIG. 6 is a cross-sectional side view of an illustrative printed circuit having a through via and a blind via in accordance with an embodiment.

If desired, printed circuits 24 and/or 24B may contain structures such as through vias and blind vias for interconnecting metal traces on different printed circuit layers. An illustrative configuration for printed circuit 24 in which both a through via and a blind via are present is shown in FIG. 6. As shown in the example of FIG. 6, printed circuit 24 may be formed form multiple layers of metal traces 84 on the upper and lower surfaces of one or more different dielectric layers 74. Printed circuit 24 may contain one or more through vias such as through via 80. Each through via may have an opening such as opening 82 that passes through one or more dielectric layers 74. The interior of opening 82 may be coated with metal traces 84 to form a conductive path between respective layers of printed circuit 24. Printed circuit 24 may also contain one or more blind vias such as blind via 86 having printed circuit substrate openings such as opening 88 that do not pass through all substrate layers 74 but rather pass through a subset of layers 74. Metal traces 84 may coat the interior surface of each blind via opening 88 to form conductive paths between respective metal layers in printed circuit 24. In the example of FIG. 6, via 86 interconnects metal traces 84 on the lowermost layer of printed circuit 24 with metal traces 84 in an embedded layer within printed circuit 24. In general vias such as blind vias and through vias may be used to join metal traces on any suitable layers within a printed circuit.

Printed circuit 24 of FIG. 6 (e.g., a printed circuit such as printed circuit 24A or printed circuit 24B) may have different numbers of layers in different areas. In the configuration of FIG. 6, for example, region 92 has three metal layers and two interposed layers of dielectric 74. Whereas region 92 has two metal layers and a single interposed layer of dielectric 74. Configurations for printed circuit 24 that have different numbers of layers in different areas or that have the same number of layers throughout printed circuit 24 may also be used. The configuration of FIG. 6 is merely illustrative.

When it is desired to form welded interconnections between printed circuit 24A and printed circuit 24B, printed circuits 24A and 24B may be aligned so that portions of traces 62 such as contact pads in traces 62 in printed circuit 24A overlap respective portions of traces 64 such as contact pads in traces 64 in printed circuit 24B. The overlapping portions of the metal traces in printed circuits 24A and 24B (i.e., the overlapping contacts) may have any suitable shapes (e.g., crosses, perpendicular lines, square pads, circular pads, grid-shapes, shapes with curved edges, non-rectangular shapes with straight edges, shapes with combinations of curved and straight edges, etc.). An at of overlapping traces may be formed that has rows and columns of overlapping contact regions or overlapping traces may have other suitable layouts.

Figure 7:
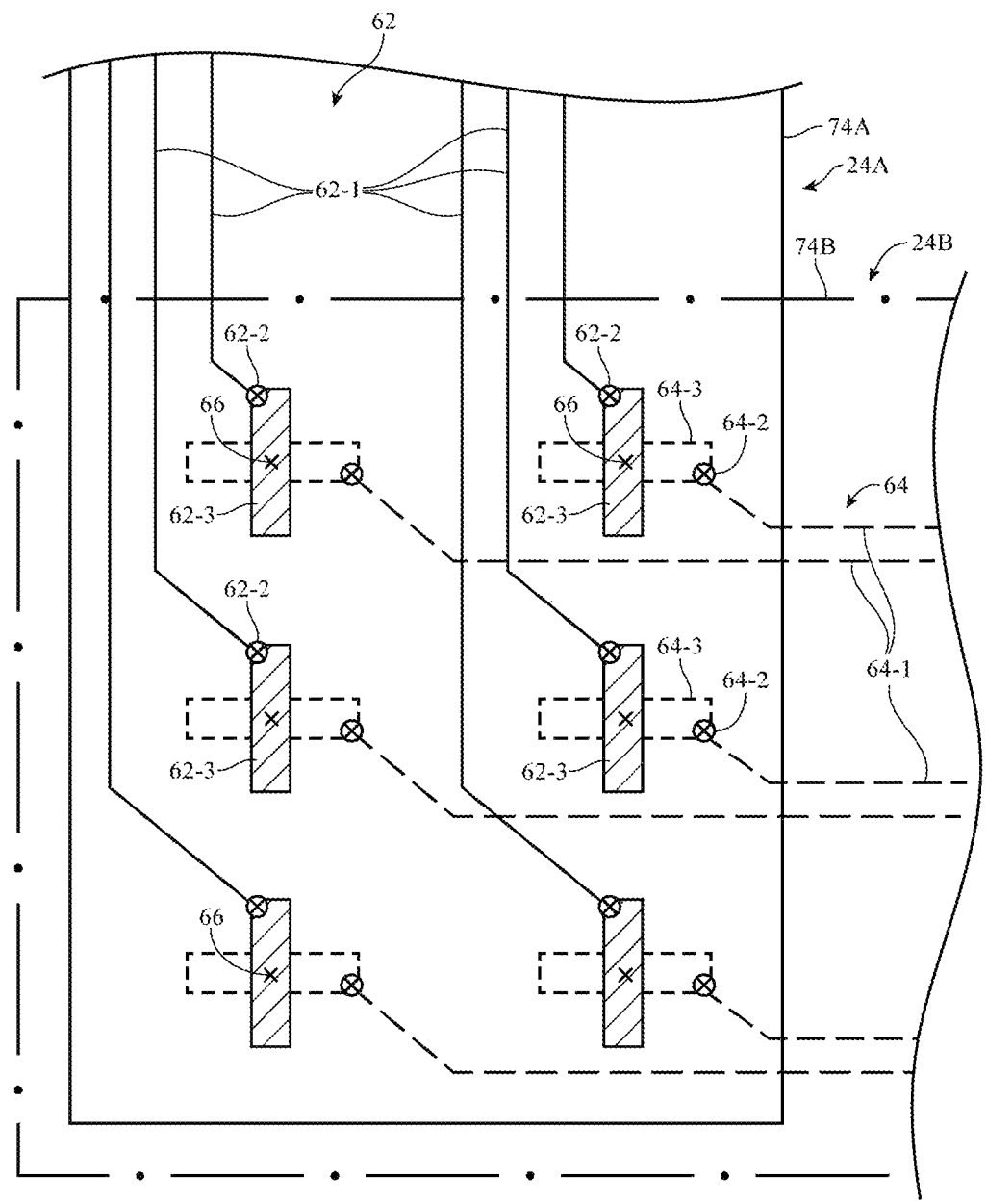
FIG. 7 is a top view of a pair of printed circuits being interconnected using an array of overlapping elongated contact pads in accordance with an embodiment.

An illustrative interconnection pattern that may be used for joining traces 62 and 64 is shown in the top view of printed circuits 24A and 24B of FIG. 7. In the illustrative configuration of FIG. 7, two printed circuits are being interconnected by laser welds 66. In particular, traces 62 on printed circuit substrate 74A of printed circuit 24A are being welded to traces 64 on printed circuit substrate 74B of printed circuit 24B using an array of laser welds 66.

Printed circuits 24A and 24B overlap each other in to rectangular region containing a three-by-two array of contacts (contact pads) extending across lateral dimensions X and Y. Traces 62 on printed circuit 24A include portions that form signal lines 62-1 that run along dimension Y. Traces 62 also include portions that form elongated contacts 62-3 that run along dimension Y. Lines 62-1 may be formed on the upper surface of substrate 74A (or may be embedded within the substrate) and contacts 62-3 may be formed on the opposing lower surface of substrate 74A. Traces 62 may include vias 62-2 that extend through substrate 74A and electrically short lines 62-1 to respective contacts 64-3. Contacts 64-3 may also include vias such as via 76 of FIG. 5. Traces 64 on printed circuit 24B include portions that form signal lines 64-1 that run along dimension X. Traces 64 also include portions that form elongated contacts 64-3 that run along dimension X. Lines 64-1 may be formed on the lower surface of substrate 74B (or may be embedded within substrate 74B) and contacts 64-3 may be formed on the opposing upper surface of substrate 74A immediately adjacent to corresponding contacts 62-3 in traces 62. Traces 64 may include vias 64-2 that extend through substrate 74B and electrically short lines 64-1 to respective contacts 64-3. Vias may also be used in forming contacts 64-3 (see. e.g., via 76 of FIG. 3).

The elongated shapes of contacts 62-3 on printed circuit 24A and mating contacts 64-3 on printed circuit 24B helps ensure that contacts 62-3 will overlap contacts 64-3 so that satisfactory laser welds 66 may be formed by laser 52 during welding, even in the event that there is slight misalignment between printed circuits 24A and 24B. Other overlapping contact pad shapes may be used for contact pads 62-3 and 64-3 if desired (e.g., shapes were one or both contacts are circular, are square have cross-shapes, have diamond shapes, etc.). When elongated contact patterns are used for the contacts of printed circuits 24A and 24B, the elongated contacts may cross perpendicularly to each other (as shown in the example of FIG. 7), may cross at a 45 angle with respect to each other, or may cross at other suitable angles.

Following coarse alignment with alignment marks 68 and 70 (FIG. 4), each contact 62-3 in printed, circuit 24A will overlap a respective contact 64-3 in printed, circuit 24B. System 42 may then be used to identify the locations of each overlapping region between these contacts. Using positioner 54, laser 52 may be moved so that beam 60 is successively aligned with each overlap region in the arrays of contacts. A weld 66 may be formed at each overlap between a contact in printed circuit 24A and a corresponding contact in printed circuit 24B, so that all desired interconnections are formed between printed circuit lines 62-1 and printed circuit lines 64-1. During welding, only some of the potential welds 66 may be formed or all welds 66 may be formed (i.e., a weld may be formed wherever one of contacts 62-3 overlaps one of contacts 64-3). Welding decisions can be made based on real time information gathered using inspection system 42, based on last minute changes to the design and layout of the structures for printed circuits 24A and 24B, etc. The resulting connections that are formed between printed circuits 24A and 24B may have limited height in direction Z and may be permanent.

Figure 8:
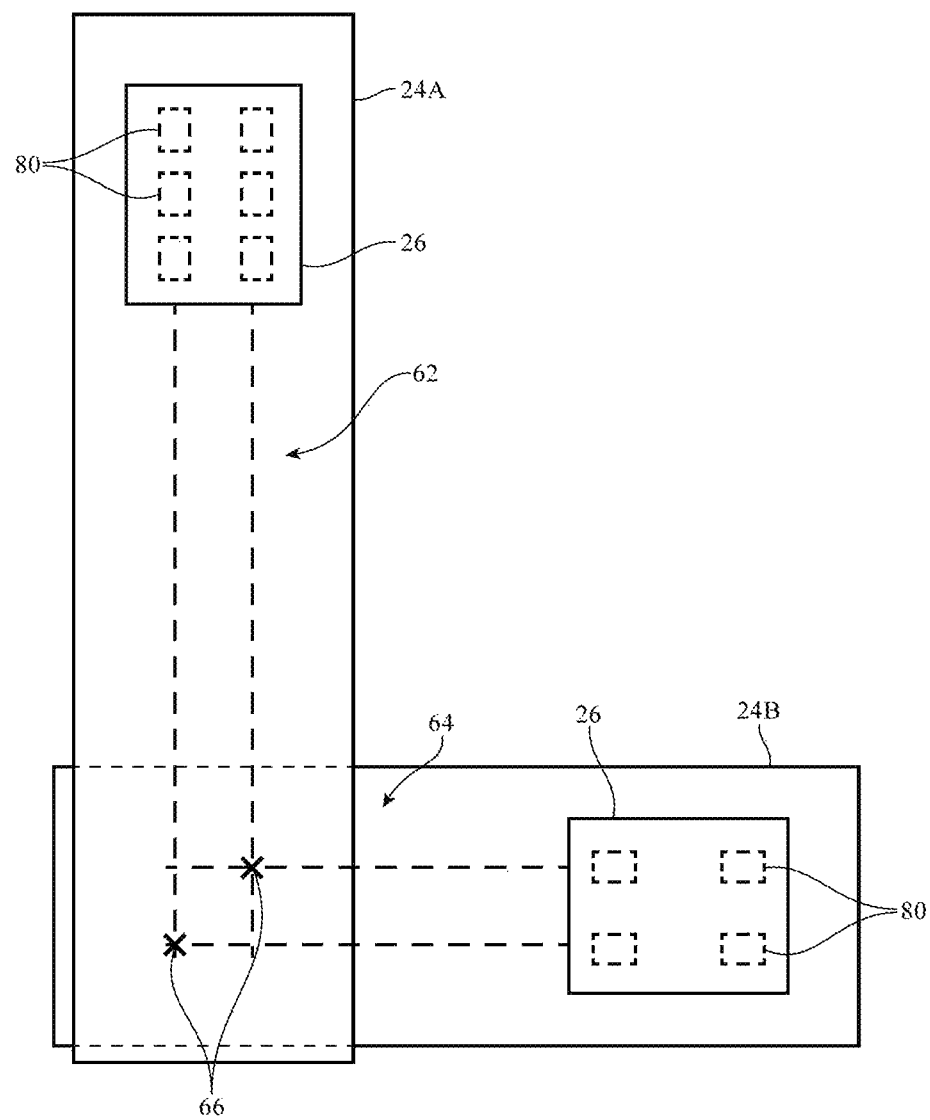
FIG. 8 is a top view of a pair of printed circuits of the type that may be interconnected using welded connections following a reflow process in which components are soldered to the printed circuits in accordance with an embodiment.

As shown in FIG. 8, electrical components 26 may be soldered to traces 62 and 64 using contacts 80. On printed circuit 24A, contacts 80 may be formed from portions of traces 62. On printed circuit 24B, contacts 80 may be formed from portions of traces 64. Components 26 may be soldered to printed circuits 24A and 24B using solder before or after forming laser welded connections 66. As an example components 26 may be soldered to printed circuits 24A and 24B before using laser welding to form connections 66. A robotic assembly tool or other equipment may place components 26 and solder paste on printed circuits 24A and 24B. Components 26 and printed circuits 24A and 24B may then be heated in a solder reflow oven or solder joints for mounting components 26 to printed circuits 24A and 24B may be formed using other soldering techniques (e.g., using hot bar soldering, using laser-based soldering, etc). After a desired number of components 26 have been mourned to printed circuits 24A and 24B, printed circuits 24A and 24B may be interconnected using laser welds 66.

Figure 9:
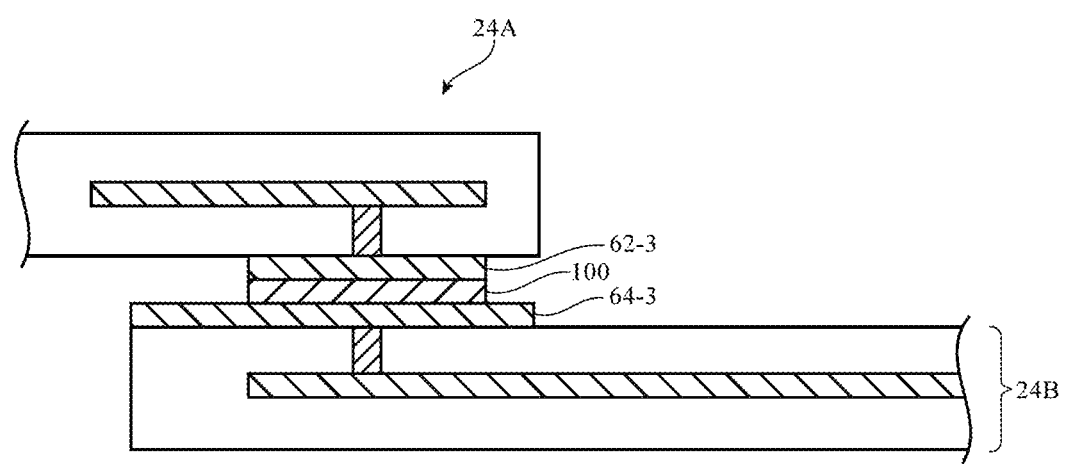
FIG. 9 is a cross-sectional side view of an illustrative electrical connection between printed circuit contacts in which a layer of solder is used to facilitate formation of the connection in accordance with an embodiment.

If desired, the contact structures that are used in forming connections between printed circuits 24A and 24B may include solder. As shown in FIG. 9, fir example, one or more solder layers such as solder layer 100 may be interposed between respective pads such as contact 62-3 and contact 64-3. Solder layer 100 may be melted when laser beam 60 is applied to weld and/or solder contacts 62-3 and 64-3 together. Hot bar heating and other heating techniques may be used instead of laser welding and/or in addition to laser welding to join contacts 62-3 and 64-3. The metal of traces 62 and 64 may be copper one or more other metals, or other suitable materials that are compatible with welding processes and other processes for forming electrical connections.

Figure 10:
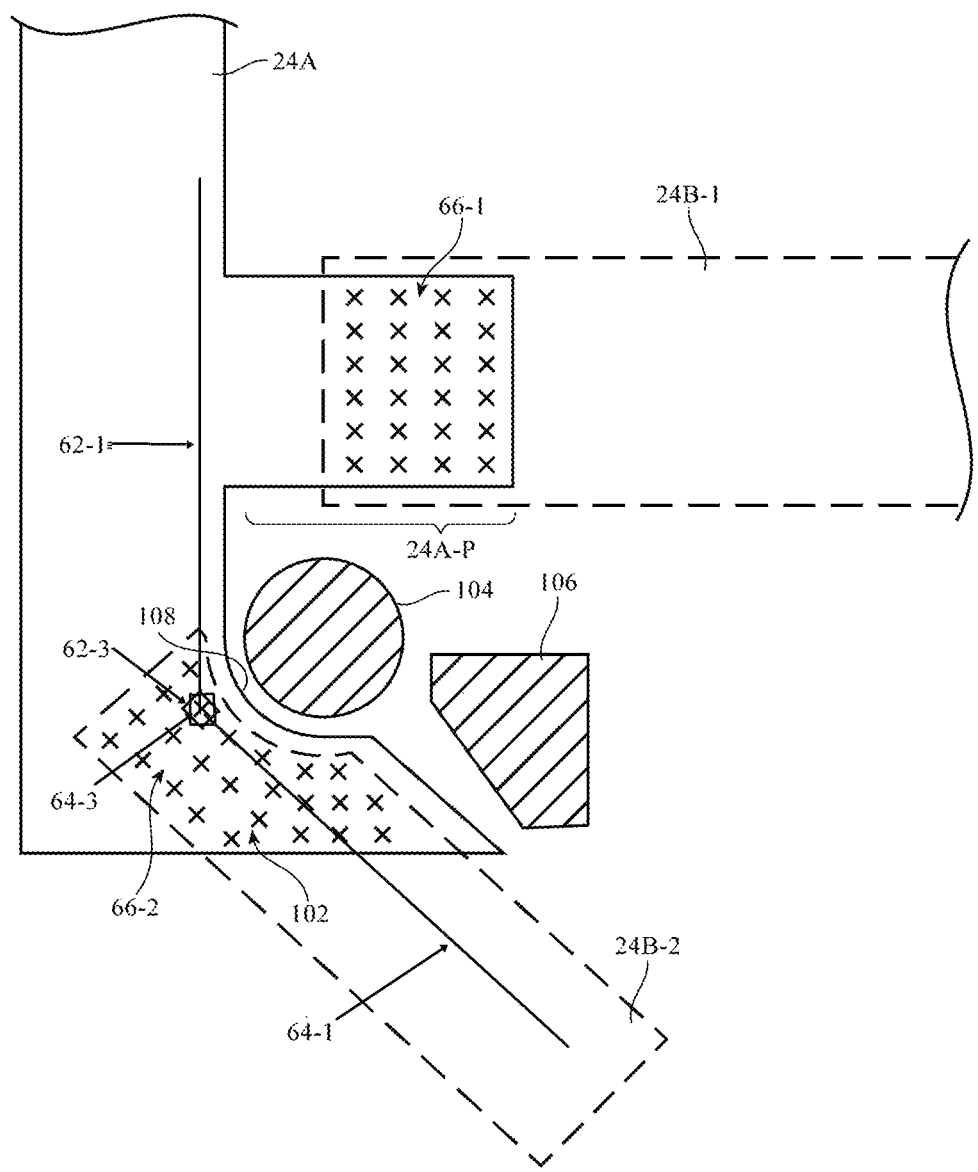
FIG. 10 is a top view of printed circuits being interconnected using multiple regions of selectively welded interconnections in accordance with an embodiment.

As shown in the illustrative top view of FIG. 10, printed circuits in device 10 may be joined using potentially complex patterns of welds 66 including non-rectangular weld patterns. There are two weld arrays in the example of FIG. 10 and each weld in these arrays is associated with an overlapping pair of contacts one of which is formed on a printed circuit and one of which is formed on an overlapping aligned second printed circuit.

As shown in FIG. 10, printed circuit 24A may, for example, be connected to printed circuit 24B-1 using laser welds 66-1 and may be connected to printed circuit 24B-2 using laser welds 66-2. Welds 66-1 may be formed within a rectangular weld region in which printed circuit protrusion 24A-P of printed circuit 24A overlaps printed circuit 24B-1. Welds 66-2 may be formed within a non-rectangular weld region such as region 102.

Lines 62-1 and contacts 62-3 on printed circuit 24A may run along dimension Y in area 102. Lines 64-1 and contacts 64-3 on printed circuit 24B in area 102 may run diagonally (i.e., at an angle of 45° to dimension Y). In region 66-1, the contact pads of printed circuit 24A and printed circuit 24B-1 may be orthogonal to each other (as an example).

Printed circuits in device 10 may have shapes that are configured to avoid obstacles such as obstacles 104 and 106 (e.g., speakers, support structures, integrated circuits on other printed circuits, housing structures, microphones, sensors, status indicators, vibrators, light-emitting components, and other components 26). For example, printed circuits 24A and 24B-2 may have curved edges such a curved edge 108 and the region of welds 66 formed between printed circuits 24A and 24B-2 may have a corresponding curved edge. The curved edges and other edges of printed circuits 24A and 24B-2 and weld region 102 may run along the edge of obstacles 104 and 106 to accommodate obstacles 104 and 106 while maximizing area for forming the array of welds 66. Because weld area 102 need not have a rectangular outline (i.e., because welds 66-2 may be spread out over the overlapping portions between printed circuits 24A and 24B in a shape other than a rectangular shape such as a shape with curved edges and/or non-perpendicular edges), it is possible to use overlapping printed circuit area efficiently. If desired, laser welded connections between contacts may be used in forming ground plane connections, rows of lateral shielding to shield signal line traces in a printed circuit, or other electrical connection structures in printed circuits.

The foregoing is merely illustrative and various modifications can be made by those skilled in the art without departing from the scope and spirit of the described embodiments. The foregoing embodiments may be implemented individually or in any combination.

What is claimed is:

1. An apparatus, comprising:
a first printed circuit having a first metal trace and a first elongated contact;
a second printed circuit having a second metal trace and a second elongated contact, wherein the first printed circuit extends along a first axis, the second printed circuit extends along a second axis that is oriented at a non-zero angle with respect to the first axis, the first elongated contact extends in parallel with the first axis and an edge of the first printed circuit, and the second elongated contact extends in parallel with the second axis and an edge of the second printed circuit; and
a laser weld that couples the first metal trace to the second metal trace, wherein the first and second contacts partially overlap and are welded together with the laser weld.

2. The apparatus defined in claim 1 wherein the first metal trace has a first signal line and wherein the second metal trace has a second signal line.

3. The apparatus defined in claim 1 wherein the first and second axes are orthogonal to each other.

4. The apparatus defined in claim 1 wherein the first and second axes are oriented at an angle of 45° with respect to each other.

5. The apparatus defined in claim 2 wherein the first elongated contact is one of a first array of elongated contacts on the first printed circuit, wherein the second elongated contact is one of a second array of elongated contacts on the second printed circuit, and wherein the laser weld is one of an array of laser welds each of which couples a respective elongated contact in the first array of elongated contacts to a respective elongated contact in the second array of elongated contacts.

6. The apparatus defined in claim 5 wherein the array of laser welds has a rectangular outline.

7. The apparatus defined in claim 5 wherein the array of laser welds has a non-rectangular outline.

8. The apparatus defined in claim 7 further comprising:
an electronic device housing in which the first and second printed circuits are located; and
a structure in the electronic device housing, wherein the first and second printed circuits and the array of laser welds have shapes that accommodates the structure.

9. The apparatus defined in claim 8 wherein at least one of the first and second printed circuits has a curved edge that runs around the structure.

10. The apparatus defined in claim 5 further comprising:
a first array of vias coupled to each of the elongated contacts in the first array of elongated contacts; and
a second array of vias coupled to each of the elongated contacts in the second array of elongated contacts.

11. An apparatus, comprising:
a first flexible printed circuit comprising metal traces forming a first set of contact pads, wherein the first flexible printed circuit has a first curved edge;
a second flexible printed circuit comprising metal traces forming a second set of contact pads, wherein the second flexible printed circuit has a second curved edge;
an electronic device component, wherein the first curved edge and the second curved edge accommodate the electronic device component, the second flexible printed circuit overlaps a non-rectangular region of the first flexible printed circuit, and the first curved edge defines an edge of the non-rectangular region; and
welds that respectively join each of the contact pads in the first set of contact pads to a corresponding one of the contact pads in the second set of contact pads, wherein the electronic device component is formed adjacent to the first curved edge of the first flexible printed circuit and the second curved edge of the second flexible printed circuit, the first flexible printed circuit extends along a first longitudinal axis, and the second flexible printed circuit extends along a second longitudinal axis that is oriented at a non-zero angle with respect to the first longitudinal axis.

12. The apparatus defined in claim 11 wherein the welds are laser welds.

13. The apparatus defined in claim 12 further comprising an electrical component soldered to the first flexible printed circuit.

14. The apparatus defined in claim 11 wherein the first and second flexible printed circuits have respective first and second alignment marks.

15. The apparatus defined in claim 11, wherein the electronic device component comprises a component selected from the group consisting of: a speaker, a support structure, an integrated circuit, an electronic device housing structure, a microphone, a sensor, a status indicator, a vibrator, and a light-emitting component.

* * * * *